United States Patent
Iwane et al.

(10) Patent No.: US 10,466,302 B2
(45) Date of Patent: Nov. 5, 2019

(54) SECONDARY BATTERY STATE DETECTING DEVICE AND SECONDARY BATTERY STATE DETECTING METHOD

(71) Applicants: FURUKAWA ELECTRIC CO., LTD., Tokyo (JP); FURUKAWA AUTOMOTIVE SYSTEMS INC., Shiga (JP)

(72) Inventors: Noriyasu Iwane, Tokyo (JP); Koichi Yokoyama, Tokyo (JP); Naoya Takashima, Tokyo (JP); Taiji Mitsuyama, Tokyo (JP); Antal Kovats, Budapest (HU); Tamas Mihalffy, Budapest (HU); Lorand Romvari, Budapest (HU)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 645 days.

(21) Appl. No.: 14/852,329

(22) Filed: Sep. 11, 2015

(65) Prior Publication Data
US 2016/0003912 A1    Jan. 7, 2016

Related U.S. Application Data

(63) Continuation of application No. PCT/JP2014/053135, filed on Feb. 12, 2014.

(30) Foreign Application Priority Data

Mar. 14, 2013   (JP) .................................. 2013-052571

(51) Int. Cl.
G01R 31/36 (2019.01)
H01M 10/48 (2006.01)
(Continued)

(52) U.S. Cl.
CPC ....... *G01R 31/3648* (2013.01); *G01R 31/392* (2019.01); *H01M 10/48* (2013.01);
(Continued)

(58) Field of Classification Search
CPC ...................................................... H01M 10/48
(Continued)

(56) References Cited

U.S. PATENT DOCUMENTS 9,247,623 B2 *   1/2016   Recker ............... H05B 33/0803
10,162,372 B2 * 12/2018   Oakes ................ G05D 23/1917
(Continued)

FOREIGN PATENT DOCUMENTS

JP     H03-183328 A     8/1991
JP     H09-166652 A     6/1997
(Continued)

OTHER PUBLICATIONS

International Search Report dated Apr. 22, 2014 for International Application No. PCT/JP2014/053135, 3 pages.

*Primary Examiner* — Manuel A Rivera Vargas
*Assistant Examiner* — Yaritza H Perez Bermudez
(74) *Attorney, Agent, or Firm* — Amin, Turocy & Watson, LLP

(57) ABSTRACT

[Object] To detect states of a plurality of secondary batteries whose kinds are different with high accuracy.
[Organization] A measurement unit (voltage sensor 11, current sensor 12) measuring a current value of a current flowing at a secondary battery 14 and a voltage value of a voltage generated at the secondary battery by the current in a predetermined frequency; an optimization unit (CPU 10*a*) optimizing element constants of an equivalent circuit model of the secondary battery based on the measured voltage value and the current value; an identification unit (CPU 10*a*) identifying a kind of the secondary battery with reference to
(Continued)

the optimized element constants of the equivalent circuit model; a storage unit (ROM 10*b*) storing detection formulas which detect the state of the secondary battery by each kind of the secondary battery; an acquisition unit (CPU 10*a*) acquiring the detection formula corresponding to the identified kind from the storage unit; and a detection unit (CPU 10*a*) detecting the state of the secondary battery by applying the element constants to the acquired detection formula, are included.

20 Claims, 9 Drawing Sheets

(51) Int. Cl.
*H02J 7/00* (2006.01)
*G01R 31/392* (2019.01)
*G01R 31/3842* (2019.01)
*G01R 31/367* (2019.01)
*G01R 31/389* (2019.01)

(52) U.S. Cl.
CPC .......... *H02J 7/0021* (2013.01); *G01R 31/367* (2019.01); *G01R 31/389* (2019.01); *G01R 31/3842* (2019.01)

(58) Field of Classification Search
USPC .............. 702/30, 33, 63, 65; 320/145; 703/2
See application file for complete search history.

(56) References Cited

U.S. PATENT DOCUMENTS

| | | | |
|---|---|---|---|
| 2009/0015203 A1* | 1/2009 | Oakes | G06Q 40/00 320/132 |
| 2012/0109443 A1* | 5/2012 | Takahashi | B60L 1/003 701/22 |
| 2014/0244225 A1* | 8/2014 | Balasingam | G06F 17/5036 703/2 |
| 2014/0375276 A1* | 12/2014 | Zeier | H01M 10/06 320/145 |

FOREIGN PATENT DOCUMENTS

| | | |
|---|---|---|
| JP | 2005-221487 A | 8/2005 |
| JP | 2007-187534 A | 7/2007 |
| JP | 2009-244180 A | 10/2009 |
| JP | 2012-132724 A | 7/2012 |

* cited by examiner

SECONDARY BATTERY STATE DETECTING DEVICE AND SECONDARY BATTERY STATE DETECTING METHOD

CROSS-REFERENCE TO RELATED APPLICATIONS

This application is a continuation application of, and claims priority to, International Application No. PCT/JP2014/053135, filed Feb. 12, 2014 and entitled "SECONDARY CELL STATE DETECTION DEVICE AND METHOD FOR DETECTING SECONDARY CELL STATE", which claims priority to Japanese Patent Application No. 2013-052571, filed Mar. 14, 2013, the disclosures of each of which are incorporated herein by reference in their entireties.

TECHNICAL FIELD

The present invention relates to a secondary battery state detecting device and a secondary battery state detecting method.

BACKGROUND ART

A method using an internal resistance or an internal impedance of a secondary battery is known to detect a state of health (SOH) and a state of function (SOF) of the secondary battery. However, the internal resistance of the secondary battery is a composition of a plurality of resistance components, and therefore, it is necessary to find by decomposing each resistance component to detect the state of the secondary battery with high accuracy, and in particular, it is necessary to find a reaction resistance with high accuracy. As technologies to enable the above, for example, technologies in Patent Document 1, and Patent Documents 2, 3 are disclosed.

Here, in the technology disclosed in Patent Document 1, pulse discharge of the secondary battery is performed at a constant voltage for the predetermined number of times by a frequency of 100 Hz or more, a voltage difference being a difference between a voltage before a start of the pulse discharge and a voltage just after an end thereof is calculated, and the state of function or the state of health of the secondary battery is judged from the voltage difference.

Besides, in the technology disclosed in Patent Document 2, a voltage/current data of an on-vehicle secondary battery of a normal real vehicle environment is acquired not by the pulse discharge, then the voltage/current data is Fourier transformed, a frequency decomposition is performed, and impedance spectrum is found. Then, a constant fitting of an is equivalent circuit model of the objective secondary battery is performed by using the found impedance spectrum, and a resistance component and a double layer capacity component in the secondary battery are decomposed to be found.

Further, in the technology disclosed in Patent Document 3, a voltage/current data of an on-vehicle secondary battery is acquired, constants of an equivalent circuit model of the objective secondary battery are online estimated by using a Kalman filter calculation and so on, and the resistance component and the double layer capacity component in the secondary battery are decomposed to be found.

PRIOR ART DOCUMENT

Patent Document

Patent Document 1: Japanese Patent Application Laid-open No. 2009-244180

Patent Document 2: Japanese Patent Application Laid-open No. 2005-221487

Patent Document 3: Japanese Patent Application Laid-open No. 2007-187534

SUMMARY OF THE INVENTION

Problems to be Solved by the Invention

Incidentally, in the technologies disclosed in Patent Documents 1 to 3, it is possible to enable highly accurate detection when the state is detected while using only a specific secondary battery as an object, but it is difficult to correspond to a plurality of secondary batteries whose kinds are different.

An object of the present invention is to provide a secondary battery state detecting device and a secondary battery state detecting method capable of detecting states of the plurality of secondary batteries whose kinds are different with high accuracy.

Means for Solving the Problems

To solve the above-sated problems, in a secondary battery state detecting device detecting a state of a secondary battery, the present invention is characterized in that it has: a measurement unit measuring a current value of a current flowing at the secondary battery and a voltage value of a voltage generated at the secondary battery by the current in a predetermined frequency; an optimization unit optimizing element constants of an equivalent circuit model of the secondary battery based on the voltage value and the current value measured by the measurement unit; an identification unit identifying a kind of the secondary battery with reference to the element constants of the equivalent circuit model which are optimized by the optimization unit; a storage unit storing detection formulas which detect the state of the secondary battery based on the element constants of the equivalent circuit model by each kind of the secondary battery; an acquisition unit acquiring the detection formula corresponding to the kind identified by the identification unit from the storage unit; and a detection unit detecting the state of the secondary battery by applying the element constants to the detection formula acquired by the acquisition unit.

With such a constitution, it becomes possible to detect the states of a plurality of secondary batteries whose kinds are different with high accuracy.

Further, one aspect of the present invention is characterized in that the identification unit identifies the kind of the secondary battery based on a mutual relationship between a plurality of element constants of the equivalent circuit model.

With such a constitution, it is possible to surely identify the kind of the secondary battery based on the mutual relationship between the element constants.

Further, one aspect of the present invention is characterized in that the identification unit compares a ratio of the plurality of element constants of the equivalent circuit model and a predetermined threshold value, and identifies the kind of the secondary battery based on a magnitude relation thereof.

With such a constitution, it is possible to easily discriminate the kind of the secondary battery based on a ratio of the element constants.

Further, one aspect of the present invention is characterized in that the identification unit compares an identification index value calculated from the plurality of element constants of the equivalent circuit model and a predetermined threshold value, and identifies the kind of the secondary battery based on a magnitude relation thereof.

With such a constitution, it is possible to more accurately identify the secondary battery based on the magnitude relation between the identification index value and the threshold value.

Further, one aspect of the present invention is characterized in that the identification unit is a learning model whose input is the constants of the equivalent circuit model of the secondary battery, and whose output is information to specify the kind of the secondary battery, the learning model having an identification ability in advance by a pair of the input/output is held, and the kind of the secondary battery is identified by the learning model.

With such a constitution, it is possible to increase an identification rate by using the learning model.

Further, one aspect of the present invention is characterized in that the learning model is a neural network or a support vector machine.

With such a constitution, it is possible to increase the identification rate of the kind of the secondary battery based on the learning model by creating the learning model whose identification ability is high in advance.

Further, one aspect of the present invention is characterized in that the identification unit identifies the kind of the secondary battery from among a lead-acid battery, a nickel hydride battery, a lithium ion battery or a nickel-cadmium battery.

With such a constitution, it is possible to identify various kinds of secondary batteries whose structures are different, and to detect the state of the identified secondary battery.

Further, one aspect of the present invention is characterized in that the identification unit identifies the kind of the secondary battery from among a flooded battery, a seal type battery or a battery for idling stop of a lead-acid battery, or a new article or a secondhand article of any of them.

With such a constitution, it is possible to identify various kinds of lead-acid batteries, and detect the state of the identified lead-acid battery.

Further, one aspect of the present invention is characterized in that the detection unit detects at least one of an initial capacity, a deteriorated capacity, a discharge residual capacity, and a response voltage for a predetermined required current of the secondary battery.

With such a constitution, it becomes possible to detect the various states of the secondary battery, and therefore, it is possible to make various determinations.

Further, in a secondary battery state detecting method detecting a state of a secondary battery, the present invention is characterized in that it has: a measurement step measuring a current value of a current flowing at the secondary battery and a voltage value of a voltage generated at the secondary battery by the current in a predetermined frequency; an optimization step optimizing element constants of an equivalent circuit model of the secondary battery based on the voltage value and the current value measured at the measurement step; an identification step identifying a kind of the secondary battery with reference to the element constants of the equivalent circuit model which are optimized by at optimization step; an acquisition step acquiring a detection formula which detects the state of the secondary battery based on the element constants of the equivalent circuit model from a storage unit where the detection formulas are stored by each kind of the secondary battery; and a detection step detecting the state of the secondary battery by applying the element constants to the detection formula acquired at the acquisition step.

With such a constitution, it becomes possible to detect the states of the plurality of secondary batteries whose kinds are different with high accuracy.

Effect of the Invention

According to the present invention, it becomes possible to provide a secondary battery state detecting device and a secondary battery state detecting method capable of detecting states of a plurality of secondary batteries whose kinds are different with high accuracy.

BEST MODE FOR CARRYING OUT THE INVENTION

Next, embodiments of the present invention will be described.

(A) Description of Constitution of First Embodiment

Figure 1:
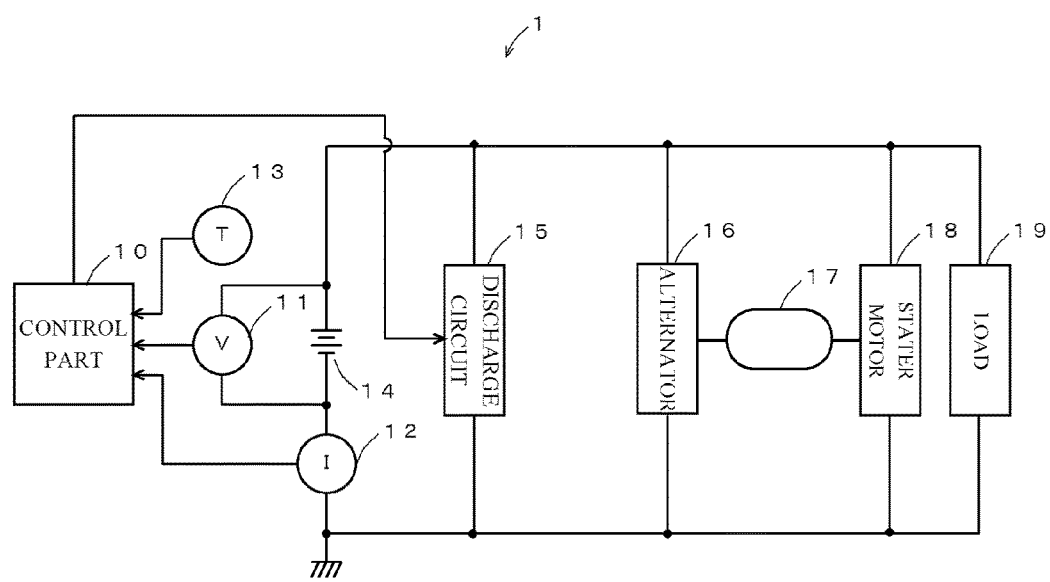
FIG. 1 is a view illustrating a configuration example of a secondary battery state detecting device according to a first embodiment of the present invention.

FIG. 1 is a view illustrating a power supply system of a vehicle having a secondary battery state detecting device according to a first embodiment of the present invention. In this drawing, a secondary battery state detecting device 1 includes a control part 10, a voltage sensor 11, a current sensor 12, a temperature sensor 13, and a discharge circuit 15 as major components, and detects a state of a secondary battery 14. Here, the control part 10 refers to outputs from the voltage sensor 11, the current sensor 12, and the temperature sensor 13 to detect the state of the secondary battery 14. The voltage sensor 11 detects a terminal voltage of the secondary battery 14, and notifies the control part 10. The current sensor 12 detects a current flowing in the secondary battery 14, and notifies the control part 10. The temperature sensor 13 detects an environmental temperature of the secondary battery 14 in itself or a periphery thereof, and notifies the control part 10. The discharge circuit 15 is made up of, for example, a semiconductor switch, a resistance element, and so on which are connected in series, and it makes the secondary battery 14 perform pulse discharge by an on/off control of the semiconductor switch by the control part 10. Note that the discharge may be performed not via the resistance element but via, for example, a constant current circuit to thereby make a discharge current constant.

The secondary battery 14 is made up of, for example, a lead-acid battery, a nickel-cadmium battery, a nickel hydride battery, a lithium ion battery, or the like, is charged by an alternator 16, drives a starter motor 18 to start an engine and supplies electric power to a load 19. The alternator 16 is driven by an engine 17, generates an alternating-current power, converts into a direct-current power by a rectifying circuit, and charges the secondary battery 14.

The engine 17 is made up of, for example, a reciprocal engine such as a gasoline engine and a diesel engine, or a rotary engine, and so on, started by the starter motor 18, drives a driving wheel via a transmission to provide a vehicle with a propulsive force, and generates electric power by driving the alternator 16. The starter motor 18 is made up of, for example, a direct current motor, generates a rotational force by the electric power supplied from the secondary battery 14, and starts the engine 17. The load 19 is made up of, for example, an electric steering motor, a defogger, an ignition coil, a car audio, a car navigation, and so on, and operated by the electric power from the secondary battery 14.

Figure 2:
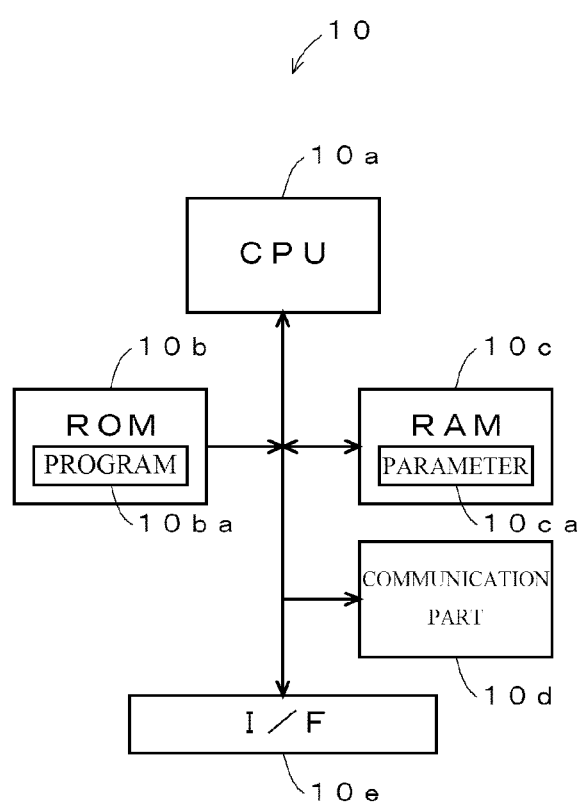
FIG. 2 is a block diagram illustrating a detailed configuration example of a control part in FIG. 1.

FIG. 2 is a view illustrating a detailed configuration example of the control part 10 illustrated in FIG. 1. As illustrated in this drawing, the control part 10 includes a CPU (Central Processing Unit) 10a, a ROM (Read Only Memory) 10b, a RAM (Random Access Memory) 10c, a communication part 10d, and an I/F (Interface) 10e. Here, the CPU 10a controls each part based on programs 10ba stored at the ROM 10b. The ROM 10b is made up of a semiconductor memory, and so on, and stores the programs 10ba, later-described expressions, and so on. The RAM 10c is made up of the semiconductor memory, and so on, and stores data generated when the programs 10ba are executed, and parameters 10ca of the later-described expressions and so on. The communication part 10d performs communications with ECU (Electric Control Unit) being a higher device and so on, and notifies detected information to the higher device. The I/F 10e converts signals supplied from the voltage sensor 11, the current sensor 12, and the temperature sensor 13 into digital signals, downloads them, and supplies a drive current to the discharge circuit 15 to control it.

(B) Description of Operations of First Embodiment

Next, operations of the first embodiment are described with reference to the drawings. Hereinafter, principles of the operations of the first embodiment are described, and thereafter, the detailed operations are described with reference to a flowchart.

Figure 3:
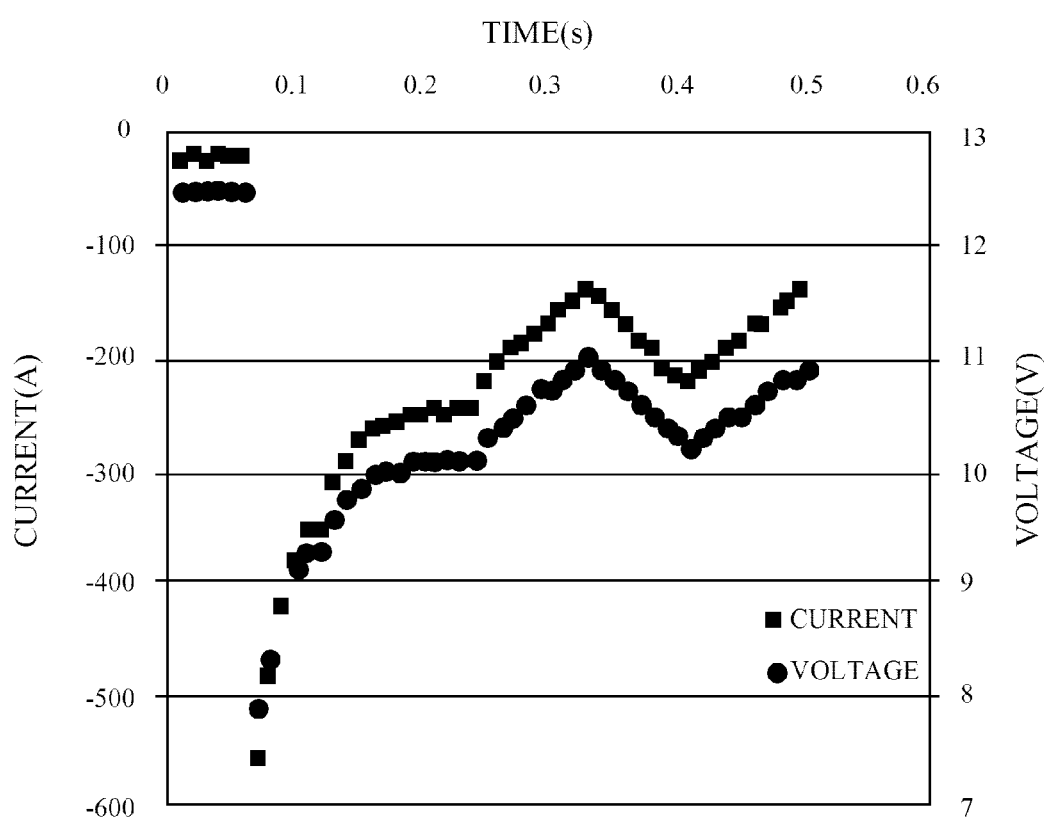
FIG. 3 is a view illustrating a temporal change of a voltage and a current at a rotation time of a starter motor.

In the CPU 10a of the control part 10, a not-illustrated ignition switch is turned into an on state, the starter motor 18 starts the rotation, then the control unit 10 acquires voltage values and current values of the secondary battery 14 output from the voltage sensor 11 and the current sensor 12 at a predetermined cycle. The CPU 10a stores the voltage values and the current values acquired as stated above to the RAM 10c. FIG. 3 illustrates a temporal change of the voltage and the current when the starter motor 18 is rotated. As illustrated in FIG. 3, when the starter motor 18 is started, the current at approximately several hundred amperes flows at the rotation start time, and the terminal voltage of the secondary battery 14 drops resulting from the current. After the starter motor 18 starts the rotation, the current decreases, and the dropping of the voltage is thereby relaxed. When the engine 17 starts and rotation is started, the current rapidly decreases, and turns into charging when the rotation exceeds a certain rotation number. The changes of the voltage and the current as stated above are sampled at a predetermined cycle, and stored at the RAM 10c.

Figure 4:
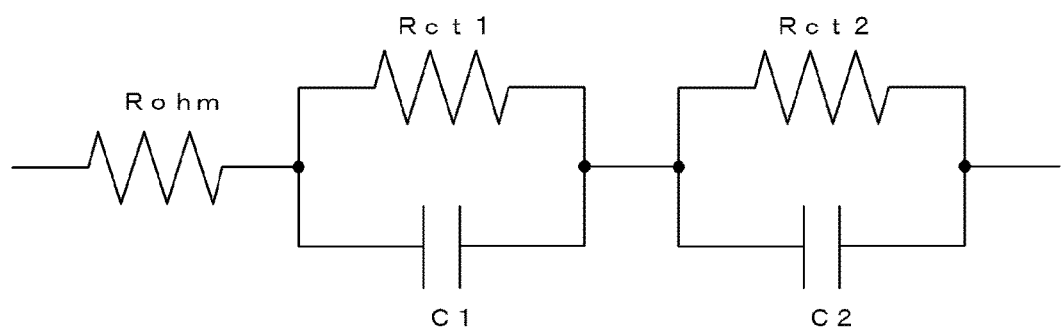
FIG. 4 is a view illustrating an example of an equivalent circuit model of a secondary battery.
Figure 5:
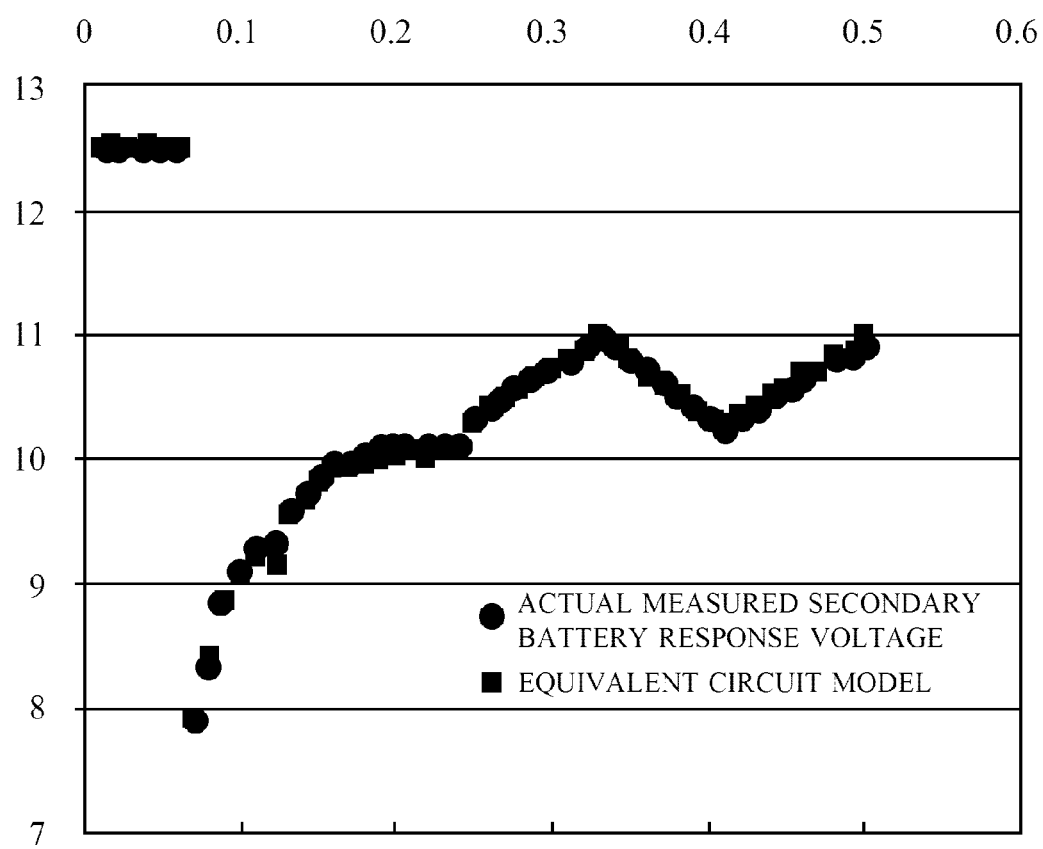
FIG. 5 is a view illustrating a relationship between the equivalent circuit model and an actually measured secondary battery response voltage.

Next, the CPU 10a acquires measurement values of the voltage and the current stored at the RAM 10c, and optimizes each of element values (Rohm, Rct1, C1, Rct2, C2) of an equivalent circuit of the secondary battery 14 illustrated in FIG. 4. Note that as a method of this optimization, for example, as it is described in Patent Publication No. 4532416, for example, an m optimum state vector X is estimated by an extended Kalman filter calculation, and adjustment parameters (element values) of the equivalent circuit are updated to optimum ones from the estimated state vector X. Specifically, a voltage drop ΔV is calculated when the secondary battery is discharged at a predetermined current pattern based on the equivalent circuit using the adjustment parameter obtained from the state vector X in a certain state, and the state vector X is updated so that the voltage drop ΔV approximates to an actual measured value. The optimum adjustment parameter is calculated from the state vector X which is optimized by the update. It goes without saying that the optimization may be performed by a method other than the above. The optimization is performed as stated above, and thereby, for example, as illustrated in FIG. 5, it is possible to set constants so that a response of the equivalent circuit model and the actual measured value (voltage response value) of the secondary battery 14 approximately match. In FIG. 5, a circle represents the actual measured value, and a square represents the response of the equivalent circuit model.

Next, the CPU 10a acquires values of the element value Rct1 of the resistance component and the element value C1 of a capacity component illustrated in FIG. 4 from among the element values of the equivalent circuit which are optimized as stated above. The CPU 10a applies the acquired value of Rct1 to, for example, a predetermined function f(Rct1), and calculates an index value to identify the kind of the secondary battery 14. Note that as the function f(Rct1) to calculate the index value, it is possible to use, for example, the following expression (1).

$$f(Rct1)=A\times\exp(B\times Rct1)+C \qquad (1)$$

Note that A, B, C are constants found in advance by experiments and so on.

The CPU 10a compares the index value f(Rct1) found as stated above and 1/C1, and when 1/C1 is over the index value f(Rct1), the CPU 10a judges that the secondary battery 14 is, for example, a secondary battery dedicated for idling stop, and when 1/C1 is not over the index value f(Rct1), the CPU 10a judges that the secondary battery 14 is, for example, a normal flooded secondary battery. Note that in the above description, the judgment is performed by using Rct1 and C1, but the values other than these (for example, Rct2 and C2) may be used. It goes without saying that Rct1, Rct2, C1, C2 may be used in combination, or Rct1 and C2, Rct2 and C1 may be used in combination.

Figure 6:
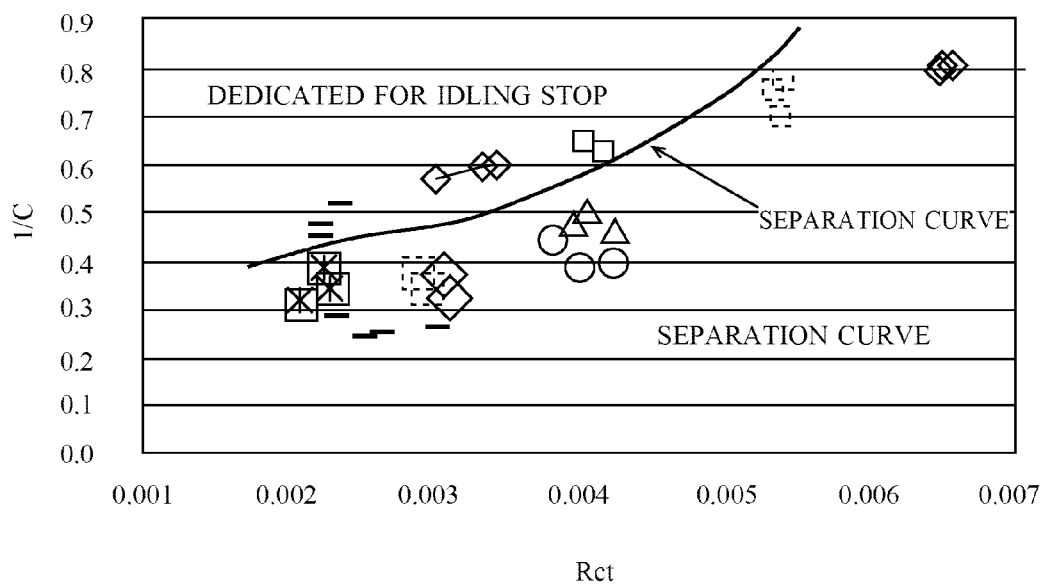
FIG. 6 is a view illustrating a relationship between constants of a secondary battery for idling stop and a normal flooded secondary battery.

In FIG. 6, a horizontal axis represents a resistance Rct, and a vertical axis represents a reciprocal (=1/C) of the capacity C, and measurement results of the secondary battery dedicated for idling stop and the normal flooded secondary battery are plotted on the graphic chart as stated above. Besides, a curve represented as a separation curve indicates the above-stated index value f(Rct). In an example in FIG. 6, the secondary battery existing at an upper side than the separation curve (an upper side in the drawing) is dedicated for idling stop, and the secondary battery existing at a lower side (a lower side in the drawing) is the normal flooded type. Accordingly, it is possible to judge whether it is dedicated for idling stop or the normal flooded type by examining a magnitude relation between the index value f(Rct) being the separation curve and the reciprocal of C (=1/C).

For example, when the CPU 10*a* judges that the secondary battery 14 is dedicated for idling stop, the CPU 10*a* acquires a detection formula fistp( ) dedicated for idling stop from the ROM 10*b*, substitutes the constants (element values) of the equivalent circuit for the acquired detection formula fistp( ), and detects the state of the secondary battery 14. On the other hand, when the CPU 10*a* judges that the secondary battery 14 is the normal flooded type, the CPU 10*a* acquires a detection formula fnrml( ) dedicated for the normal flooded type from the ROM 10*b*, substitutes the constants of the equivalent circuit for the acquired detection formula fnrml( ), and detects the state of the secondary battery 14. Note that as the states of the secondary battery 14 detected from the constants of the equivalent circuit model, for example, there are an initial capacity, a deteriorated capacity, a discharge residual capacity, a response voltage for a predetermined required current of the secondary battery 14, and so on. For example, when an initial capacity (SOH_ini) is exemplified, it is possible to calculate by the following expression.

$$SOH\_ini = Const1 \times Rohm + Const2 \times Rct1 + Const3 \times C1 + Const4 \times Rct2 + Const5 \times C2 + Const6 \quad (2)$$

Here, constants Const1 to Const6 in the expression (2) are able to optimally determine by each kind of the secondary battery to be identified. Besides, it is also possible to use different calculation expressions depending on the kind of the secondary battery.

Note that it is possible to detect or calculate the other states of the secondary battery according to a similar way of thinking. Besides, it is also possible to optimize calculation expressions when a correction calculation of a temperature dependence and an SOC (state of charge) dependence of the constants of the equivalent circuit model are performed by each kind of the secondary battery according to the similar way of thinking. Namely, not only the states of the secondary battery but also the calculation expressions and to coefficients of the correction calculation are stored by each kind of the secondary battery, and the correction calculation can be performed by using the calculation expression and the coefficient which correspond to the identified kind of the secondary battery.

As stated above, according to the first embodiment of the present invention, the kind of the secondary battery 14 is identified based on the constants of the equivalent circuit model, the state of the secondary battery 14 is detected by using the detection formula in accordance with the identified kind, and therefore, it becomes possible to accurately detect the state regardless of the kind of the secondary battery 14.

Figure 7:
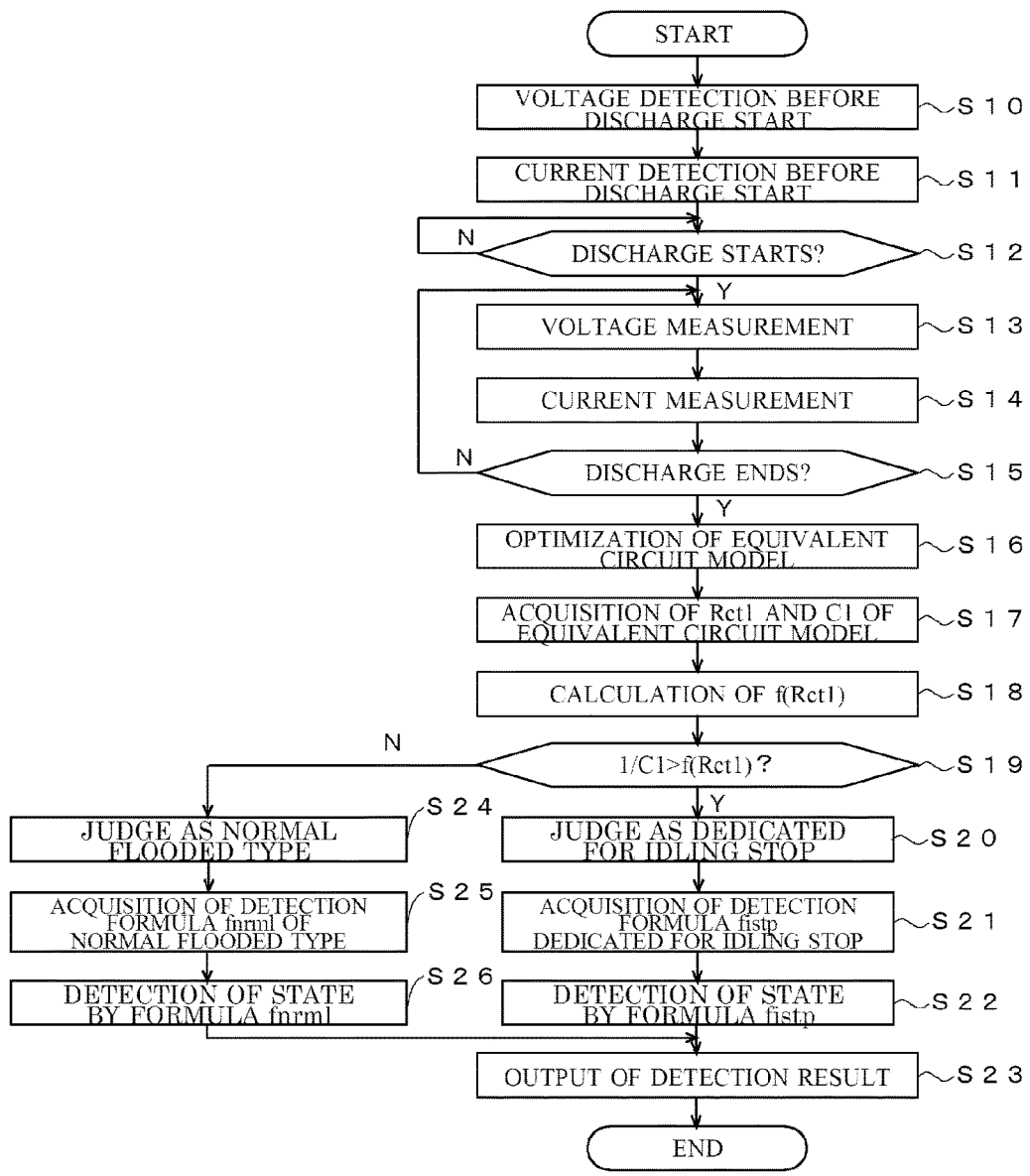
FIG. 7 is a flowchart to explain a flow of processes executed in the first embodiment.

Next, an example of processes executed in the first embodiment illustrated in FIG. 1 is described with reference to FIG. 7. FIG. 7 is a flowchart to explain the example of the processes executed in the first embodiment. When the processes in the flowchart are started, the following steps are executed. Note that the processes in this drawing are executed when, for example, a not-illustrated ignition switch is operated. It goes without saying that it may be a timing other than the above.

At the step S10, the CPU 10*a* acquires a voltage before a discharge is started, namely, a voltage before the rotation of the starter motor 18 is started from the voltage sensor 11.

At the step S11, the CPU 10*a* acquires a current before the discharge is started, namely, a current before the rotation of the starter motor 18 is started from the current sensor 12.

At the step S12, the CPU 10*a* judges whether or not the discharge is started, and when it is judged that the discharge is started (step S12: Yes), the process proceeds to step S13, and in the other cases (step S12: No), the similar processes are repeated. For example, when the rotation of the starter motor 18 is started, it is judged to be Yes, and the process proceeds to the step S13.

At the step S13, the CPU 10*a* refers to an output of the voltage sensor 11, and measures the voltage of the secondary battery 14.

At the step S14, the CPU 10*a* refers to an output of the current sensor 12, and measures the current of the secondary battery 14.

At the step S15, the CPU 10*a* judges whether or not the discharge ends, and when it is judged that the discharge ends (step S15: Yes), the process proceeds to step S16, and returns to the step S13 to repeat the similar processes in the other cases (step S15: No). Note that the judgment whether or not the discharge ends is able to be done from cases, for example, if the rotation of the starter motor 18 is stopped, the engine 17 is started, or the ignition switch is restored from a start position.

At the step S16, the CPU 10*a* executes the optimization of each element of the equivalent circuit model. Note that as the optimization method, for example, as it is described in Patent Publication No. 4532416, for example, the optimum state vector X is estimated by the extended Kalman filter calculation, and the adjustment parameters (element values) of the equivalent circuit are updated to the optimum ones from the estimated state vector X. Specifically, the voltage drop $\Delta V$ is calculated when the secondary battery is discharged at the predetermined current pattern based on the equivalent circuit using the adjustment parameter obtained from the state vector X in the certain state, and the state vector X is updated so that the voltage drop $\Delta V$ approximates to the actual measured value. The optimum adjustment parameter is calculated from the state vector X which is optimized by the update.

At the step S17, the CPU 10*a* acquires, for example, Rct1 and C1 from among the constants of the equivalent circuit model which are optimized at the step S16.

At the step S18, the CPU 10*a* applies the constant Rct1 to the function f(Rct1), and calculates the index value to identify the kind of the secondary battery 14. Note that as the function f(Rct1) to calculate the index value, for example, it is possible to use the above-stated expression (1).

At the step S19, the CPU 10*a* compares the index value calculated at the step S18 with 1/C1, and when 1/C1>f(Rct1) is satisfied (step S19: Yes), the process proceeds to step S20, and in the other cases (step S19: No), the process proceeds to step S24.

At the step S20, the CPU 10*a* judges that the secondary battery 14 is dedicated for idling stop.

At the step S21, the CPU 10*a* acquires the detection formula fistp which is dedicated for idling stop from the ROM 10*b*. Note that the detection formula fistp dedicated for idling stop is a expression which is specialized for the secondary battery dedicated for idling stop, and it is possible to accurately detect the state of the secondary battery dedicated for idling stop by using this expression.

At the step S22, the CPU 10*a* detects the state of the secondary battery dedicated for idling stop based on the detection formula fistp acquired at the step S21. Note that as the states to be detected, for example, there are the initial capacity, the deteriorated capacity, the discharge residual capacity, the response voltage for the predetermined required current, and so on of the secondary battery 14. For example, when the initial capacity (SOH_ini) is exemplified, it is possible to calculate by the above-stated expression (2).

At the step S23, the CPU 10a outputs a detection result of the secondary battery 14 calculated at the step S22.

At the step S24, the CPU 10a judges that the secondary battery 14 is the normal flooded type.

At the step S25, the CPU 10a acquires the detection formula fnrml dedicated for the normal flooded type from the ROM 10b. Note that the detection formula fnrml dedicated for the normal flooded type is specialized for the normal flooded secondary battery, and it is possible to accurately detect the state of the normal flooded secondary battery by using this expression.

At the step S26, the CPU 10a detects the state of the normal flooded secondary battery based on the detection formula fnrml acquired at the step S25. Note that as the states to be detected, for example, there are the initial capacity, the deteriorated capacity, the discharge residual capacity, the response voltage for the predetermined required current, and so on of the secondary battery 14. For example, when the initial capacity (SOH_ini) is exemplified, it is possible to calculate by the above-stated expression (2). Note that the state of the normal flooded secondary battery found as stated above is output at the step S23.

According to the processes as stated above, it becomes possible to enable the above-described operations.

(C) Description of Constitution of Second Embodiment

Next, operations of a second embodiment are described with reference to the drawings. Hereinafter, principles of operations of the second embodiment are described, and thereafter, the detailed operations are described with reference to a flowchart.

The second embodiment has the similar constitution with the case of the first embodiment, but a part of the processes executed at the control part 10 is different from the first embodiment. Hereinafter, it is described centering on parts different from the first embodiment. In the first embodiment, the kind of the secondary battery 14 is identified based on the index value f(Rct1) as stated above, but in the second embodiment, the kind of the secondary battery 14 is identified based on a supervised learning model. Note that as supervised learning processes, for example, a neural network or a support vector machine can be used. Hereinafter, a case when the neural network is used is exemplified to be described.

(D) Description of Operations of Second Embodiment

Figure 8:
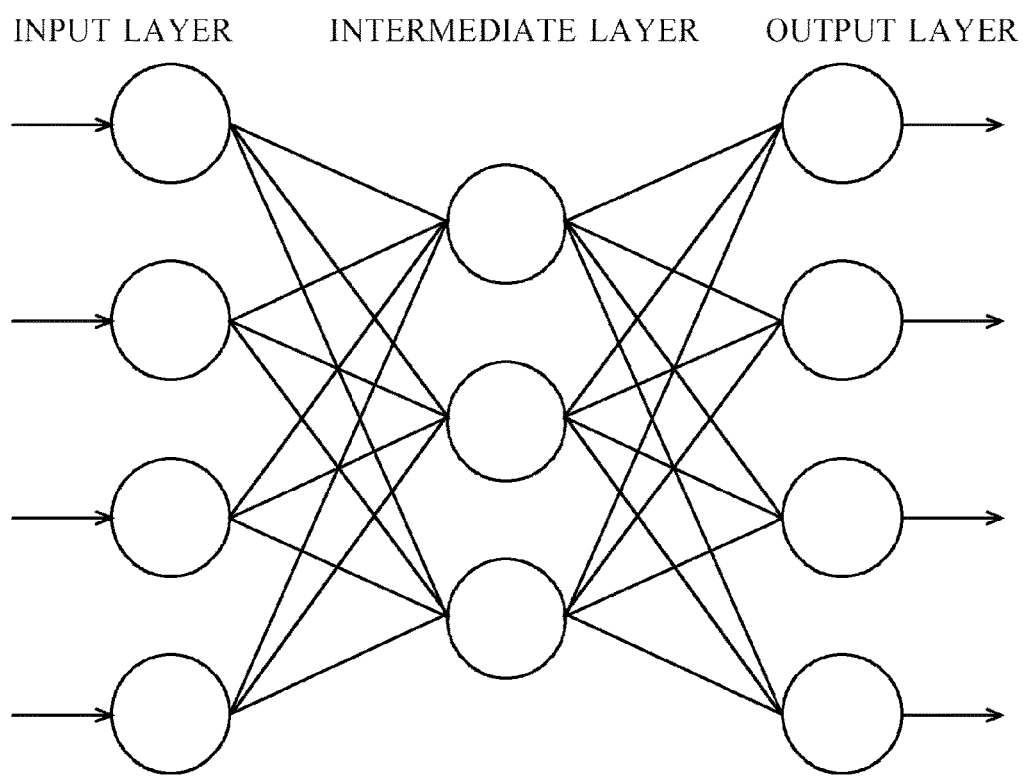
FIG. 8 is a view illustrating a configuration example of a supervised learning model used in a second embodiment.

Next, operations of the second embodiment are described. In the second embodiment, for example, a learning process of a multistage neural network illustrated in FIG. 8 is executed by using constants of the equivalent circuit model of a plurality of kinds of secondary batteries. Specifically, the constants of the equivalent circuit model of the secondary battery are set to be inputs, and weighting of an input signal, optimization of an ignition threshold value and so on of neuron, or the like are executed by, for example, a back propagation (minimum error propagation method) so that information to specify the kind of the secondary battery is to be output. After that, it is thereby possible to identify the battery kind by inputting the constants of the equivalent circuit model to the learned neural network. Note that as the kinds of the secondary battery to be identified, for example, there are a lead-acid battery, a nickel hydride battery, a lithium ion battery, and a nickel-cadmium battery. Besides, any of a flooded storage battery, a seal type storage battery, or a storage battery for idling stop of the lead-acid battery, or a new article or a secondhand article of any of them may be identified.

In the second embodiment, the kind of the secondary battery 14 is identified by using the neural network which has learned in advance as stated above. Specifically, the optimization of the equivalent circuit model is executed, the constants of the equivalent circuit illustrated in FIG. 4 obtained by the optimization are input to the neural network, and thereby, the information to specify the kind of the secondary battery 14 is output. For example, when the secondary battery 14 is the lead-acid battery for idling stop, all or a part of the constants Rohm, Rct1, C1, Rct2, C2 of the elements constituting the equivalent circuit model are given to the neural network as the inputs, and thereby, the information (ignition pattern of an output layer) to specify that it is the lead-acid battery for idling stop is output.

The kind of the secondary battery 14 is specified, then, the detection formula corresponding to the specified kind is acquired from the ROM 10b, the constants of the elements constituting the equivalent circuit model are substituted to the detection formula, and the state of the secondary battery 14 is detected. For example, in the above-stated case, the detection formula corresponding to the lead-acid battery for idling stop is acquired from the ROM 10b, for example, the constants Rohm, Rct1, C1, Rct2, C2 of the elements constituting the equivalent circuit model are substituted to the detection formula, and the state of the secondary battery 14 is detected. According to the processes as stated above, it is possible to increase an identification rate of the kind of the secondary battery compared to the first embodiment. Accordingly, it becomes possible to accurately detect the states of a plurality of kinds of secondary batteries.

Next, operations of the second embodiment are described with reference to a flowchart illustrated in FIG. 9. Note that in the flowchart illustrated in FIG. 9, the same reference symbols are supplied for parts corresponding to the flowchart in FIG. 7, and the description thereof is not given. In the flowchart illustrated in FIG. 9, the processes of the steps S17 to S26 are replaced by steps S40 to S44 compared to the flowchart in FIG. 7. The processes other than these are the same as the case in FIG. 7. Hereinafter, it is described centering on the processes of the steps S40 to S44.

At the steps S10 to S16, as same as the above-stated case, the voltage value and the current value when the starter motor 18 is rotated are measured at a predetermined interval, and stored at the RAM 10c. The equivalent circuit model is optimized based on the voltage value and the current value stored at the RAM 10c.

At the step S40, the CPU 10a acquires the constants of the equivalent circuit model. For example, at least a part of the constants from among the constants Rohm, Rct1, C1, Rct2, C2 of the elements constituting the equivalent circuit model is acquired.

At the step S41, the CPU 10a inputs the constants acquired at the step S40 to the supervised learning model where the learning is performed in advance. For example, as the supervised learning model, there is the neural network, and at the process of the step S41, the CPU 10a inputs at least a part of the constants from among the constants Rohm, Rct1, C1, Rct2, C2 of the elements acquired at the step S40 for the neural network.

At the step S42, the CPU 10a acquires outputs of the supervised learning model. For example, when the constant of the equivalent circuit of the lead-acid battery dedicated for idling stop is input, the information indicating that it is the lead-acid battery dedicated for idling stop is output, and therefore, the information is acquired at the step S42.

At the step S43, the CPU 10a acquires a detection formula f( ) corresponding to the output acquired at the step S42 from the ROM 10b. For example, when the information indicating that it is the lead-acid battery dedicated for idling stop is output, the detection formula f( ) corresponding to the lead-acid battery dedicated for idling stop is acquired from the ROM 10b.

At the step S44, the CPU 10a detects the state of the secondary battery based on the detection formula f( ) acquired at the step S43. For example, as the states to be detected, for example, there are the initial capacity, the deteriorated capacity, the discharge residual capacity, the response voltage for the predetermined required current, and so on of the secondary battery 14. For example, when the initial capacity (SOH_ini) is exemplified, it is possible to calculate by the above-stated expression (2).

At the step S23, the CPU 10a outputs the state of the secondary battery found at the step S44.

According to the above-stated processes, the kind of the secondary battery 14 is identified by using the supervised learning model, and the state of the secondary battery 14 is detected by using the detection formula corresponding to the identification result, and therefore, it is possible to accurately detect the state regardless of the kind of the secondary battery 14.

(E) Description of Modified Embodiment

The above-stated embodiments are examples only, and it goes without saying that the present invention is not limited to the above-described cases. For example, in the first embodiment, the kind of the secondary battery 14 is judged based on the relationship between the constants Rtc1 and C1, but it m may be judged by using the constants other than the above. Besides, it may be judged not by using two kinds of constants but by using three kinds or more constants. Besides, it is identified by using the function illustrated in the expression (1), but for example, a ratio between two constants (for example, a ratio between Rohm and Rct1) may be compared with a predetermined threshold value to thereby judge. In more detail, it may be identified by comparison with threshold values which are found in advance by experiments such as Rohm/Rct1, Rct1/Rct2, Rct1/C1 . . . and so on.

Besides, constants of another equivalent circuit model may be used in accordance with the kind of the secondary battery to be identified, and an identification index may be calculated by a different calculation expression. Besides, the identification index may be calculated by using constants of a plurality of equivalent circuit models, or as an identification method, it may be identified whether or not the constants exceed a predetermined threshold value found in advance by experiments and so on.

Besides, in the first embodiment, a distinction between the normal flooded type and the idling stop type is performed as the kind of the secondary battery 14, but a distinction as for the kinds other than the above may be performed. For example, the initial capacity of the secondary battery 14, a manufacturer, a model number, and so on may be identified.

Besides, in the above-stated each embodiment, the case when the initial capacity (SOH_ini) of the secondary battery 14 is found is exemplified, but it is also possible to find the deteriorated capacity, the discharge residual capacity, and the response voltage for the predetermined required current other than the initial capacity. Note that as expressions to find them, it is possible to use a expression similar to the above-stated expression (2), or a function using at least a part of the elements of the equivalent circuit model.

Besides, in the second embodiment, the kind of the secondary battery 14 is identified by using the neural network, but a supervised learning model other than the neural network may be used. For example, the support vector machine may be used. As for the example of FIG. 4, in the support vector machine, the separation curve is determined such that a minimum value of a distance from the separation curve to each sample point of the supervised data becomes maximum (to maximize a margin) in a supervised data, and thereby, it is possible to find the separation curve whose identification ability is high. Further, depending on cases, it is also possible to similarly find a separating hyperplane and a hypersurface at a hypercomplex space using a plurality of model constants. Namely, a method may be used in which the constants of the equivalent circuit model are learned as for the secondary batteries of already known kinds, the separating hyperplane and the hypersurface are found by the supervised learning using the already known data as the supervised data, and after that, the identification is performed by using the separating hyperplane and the hypersurface.

Besides, in the above-stated each embodiment, the equivalent circuit model is optimized based on the changes of the voltage and the current when the starter motor 18 is rotated, but the optimization may be performed based on the current flowing for a load other than the starter motor 18. For example, the discharge circuit 15 is switching operated, the voltage and the current of the secondary battery 14 at that time are detected, and the equivalent circuit model may be optimized based on the detected voltage and current.

Besides, in the above-stated each embodiment, the model illustrated in FIG. 4 is used as the equivalent circuit model, but an equivalent circuit model other than this may be used. For example, an equivalent circuit model in which a resistance element and a capacity element which are connected in parallel are connected in series for three stages or more may be used. It goes without saying that equivalent circuit models other than this may be used.

Figure 9:
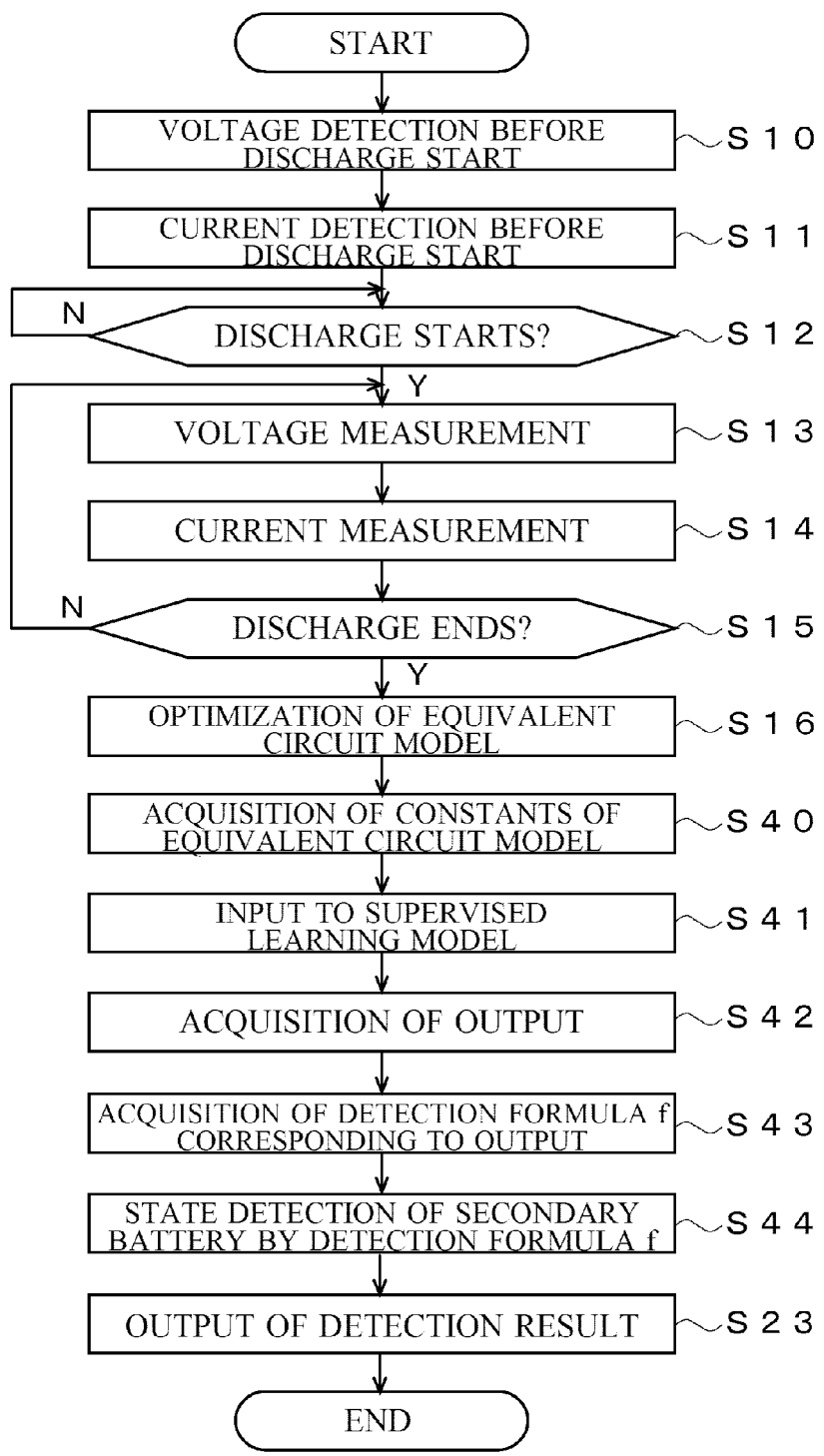
FIG. 9 is a flowchart to explain a flow of processes executed in the second embodiment.

Besides, the flowcharts illustrated in FIG. 7 and FIG. 9 are examples, and the processes may be executed in a sequence other than the above, or the processes other than the above may be executed.

Besides, in the above-stated each embodiment, only the state detection of the secondary battery 14 is performed, but for example, idling of the engine 17 is stopped based on, for example, the found state, so-called an execution of the idling stop may be controlled. Specifically, when the SOC of the secondary battery 14 is higher than a predetermined threshold value, the idling stop may be executed, and when it is judged to be lower than the predetermined threshold value, the idling stop may not be executed. Besides, when the SOH approximates to a predetermined threshold value, for example, the operation of the load 19 is stopped, and a further consumption of the secondary battery 14 may be prevented. Further, when the SOH is smaller than the predetermined threshold value, a message indicating that the secondary battery 14 is to be exchanged may be displayed.

EXPLANATION OF REFERENCE SIGNS 1 secondary battery state detecting device
10 control part (optimization unit, identification unit, acquisition unit, detection unit)
10a CPU
10b ROM (storage unit)

10c RAM
10d communication part
10e I/F
11 voltage sensor (measurement unit)
12 current sensor (measurement unit)
13 temperature sensor
14 secondary battery
15 discharge circuit
16 alternator
17 engine
18 starter motor
19 load

The invention claimed is:

1. A secondary battery state detecting device of a vehicle enabling detecting a state of a secondary battery in the vehicle, comprising:
a processor; and
a memory that stores executable instructions that, when executed by the processor, facilitate performance of operations, comprising:
measuring, in response to actuation of a vehicle ignition switch and at a determined frequency, a current value of a current flowing at the secondary battery in the vehicle and a voltage value of a voltage generated at the secondary battery in the vehicle;
updating a plurality of element constants of an equivalent circuit model of the secondary battery based on the voltage value and the current value;
determining a battery type of the secondary battery from a group of battery types of batteries based on a mutual relationship between the plurality of the element constants of the equivalent circuit model, the group of the battery types comprising at least a first type of battery and a second type of battery that is different than the first type of battery;
storing detection formulas which facilitate detecting the state of the secondary battery based on the plurality of the element constants of the equivalent circuit model by each battery type of the secondary battery;
acquiring a detection formula, of the detection formulas, corresponding to the battery type of the secondary battery in the vehicle;
determining the state of the secondary battery in the vehicle by applying the plurality of the element constants to the detection formula; and
altering, via an engine control unit, a performance of the vehicle based on the state of the secondary battery.

2. The secondary battery state detecting device according to claim 1, wherein the battery type of the secondary battery is a first battery type, wherein the determining further comprises determining a second battery type of another secondary battery of the vehicle based on another mutual relationship between another plurality of other element constants of another equivalent circuit model corresponding to the other secondary battery, and wherein the first battery type is a different battery type than the second battery type.

3. The secondary battery state detecting device according to claim 1, wherein the determining the battery type comprises comparing a ratio of the plurality of the element constants of the equivalent circuit model and a predetermined threshold value, and determining the battery type of the secondary battery based on a magnitude relation thereof.

4. The secondary battery state detecting device according to claim 1, wherein the determining the battery type comprises comparing an identification index value calculated from the plurality of the element constants of the equivalent circuit model and a predetermined threshold value, and determining the battery type of the secondary battery based on a magnitude relation thereof.

5. The secondary battery state detecting device according to claim 1, wherein the determining the battery type comprises employing a learning model that receives the plurality of the element constants of the equivalent circuit model of the secondary battery, and that generates type information corresponding to the battery type of the secondary battery, and wherein the learning model employs a modeled element constant to facilitate generating the type information.

6. The secondary battery state detecting device according to claim 5, wherein the learning model is a neural network or a support vector machine.

7. The secondary battery state detecting device according to claim 1, wherein the group of the battery types comprises a lead-acid battery type, a nickel hydride battery type, a lithium ion battery type, and a nickel-cadmium battery type.

8. The secondary battery state detecting device according to claim 1,
wherein the group of the battery types comprises flooded battery type, a seal type battery type, a battery type for idling stop of a lead-acid battery, a new battery type, and a used battery type.

9. The secondary battery state detecting device according to claim 1, wherein the determining the state of the secondary battery comprises detecting at least one of an initial capacity, a deteriorated capacity, a discharge residual capacity, or a response voltage for a predetermined required current of the secondary battery in the vehicle.

10. A secondary battery state detecting method facilitating detecting a state of a secondary vehicle battery, comprising:
measuring, by a system comprising a processor at a determined frequency, a current value of a current flowing at the secondary vehicle battery and a voltage value of a voltage generated by the current flowing at the secondary vehicle battery;
determining, by the system, element constants of an equivalent circuit model of the secondary vehicle battery based on the voltage value and the current value;
identifying, by the system, a battery type of the secondary vehicle battery from a group of battery types of batteries based on the element constants of the equivalent circuit model, the group of the battery types comprising at least a first type of battery and a second type of battery that is different than the first type of battery;
acquiring, by the system based on the battery type of the secondary vehicle battery, a detection formula which detects the state of the secondary vehicle battery based on the element constants of the equivalent circuit model from a storage device, wherein the detection formulas are stored at the storage device and indexed by battery type;
indicating, by the system, the state of the secondary vehicle battery by applying the element constants to the detection formula; and
indicating, by the system, the state of the secondary vehicle battery to an engine control unit of a vehicle comprising the secondary vehicle battery to facilitate altering a performance of the vehicle based on the state of the secondary vehicle battery.

11. The secondary battery state detecting method according to claim 10, wherein the identifying the battery type of the secondary vehicle battery comprises determining a magnitude value based on comparing of a ratio of the element constants of the equivalent circuit model and a predetermined threshold value.

12. The secondary battery state detecting method according to claim 10, wherein the identifying the battery type of the secondary vehicle battery comprises determining a magnitude value based on comparing an identification index value calculated from the element constants of the equivalent circuit model and a predetermined threshold value.

13. The secondary battery state detecting method according to claim 10, wherein the identifying the battery type of the secondary vehicle battery comprises a learning model that receives the element constants of the equivalent circuit model of the secondary vehicle battery.

14. The secondary battery state detecting method according to claim 13, wherein the learning model is a neural network.

15. The secondary battery state detecting method according to claim 13, wherein the learning model is a support vector machine.

16. The secondary battery state detecting method according to claim 10, wherein the group of the battery types comprises a lead-acid battery type, a nickel hydride battery type, a lithium ion battery type, a nickel-cadmium battery type, a flooded battery type, a seal type battery type, a battery type for idling stop of a lead-acid battery, a new battery type, and a used battery type.

17. A device, comprising:
a processor; and
a memory that stores executable instructions that, when executed by the processor, facilitate performance of operations, comprising:
in response to connection of the device to a vehicle battery of unknown battery type, measuring, at a determined frequency, a current value of a current flowing at the vehicle battery and a voltage value of a voltage generated by the current flowing at the vehicle battery;
adjusting circuit constants of an equivalent circuit model of the vehicle battery based on the voltage value and the current value, wherein the adjusting results in the equivalent circuit model better matching the voltage value and the current value than before the adjusting the circuit constants of the equivalent circuit model of the vehicle battery;
determining a battery type of the vehicle battery from a group of battery types of batteries based on the circuit constants of the equivalent circuit model, the group of the battery types comprising at least a first type of battery and a second type of battery that is different than the first type of battery;
selecting from a data store of state detection formulas for corresponding battery types of batteries, based on the battery type of the vehicle battery, a state detection formula to enable determining a state of the vehicle battery based on the circuit constants of the equivalent circuit model; and
modifying, via an engine control unit of a vehicle comprising the vehicle battery, performance of the vehicle based on the state of the vehicle battery.

18. The device of claim 17, wherein the vehicle battery is a first vehicle battery and, in response to disconnection of the first vehicle battery from the device and reconnection of the device to a second vehicle battery of unknown battery type, measuring, at another determined frequency, another current value of another current flowing at the second vehicle battery and another voltage value of another voltage generated by the other current flowing at the second vehicle battery;
adjusting other circuit constants of another equivalent circuit model of the second vehicle battery based on the other voltage value and the other current value, wherein the adjusting results in the other equivalent circuit model better matching the other voltage value and the other current value than before the adjusting the circuit constants of the other equivalent circuit model of the second vehicle battery;
determining another battery type of the second vehicle battery based on the other circuit constants of the other equivalent circuit model, wherein the other battery type is a different battery type than the battery type of the first vehicle battery;
selecting from the data store, based on the other battery type of the second vehicle battery, another state detection formula to enable determining another state of the second vehicle battery based on the other circuit constants of the other equivalent circuit model; and
indicating, to the engine control unit, the other state of the second vehicle battery based on the other circuit constants and the other state detection formula, wherein the indicating results in a display of the other state of the second vehicle battery.

19. The device of claim 17, wherein the determining the battery type of the vehicle battery comprises determining a magnitude value based on comparing of a ratio of the circuit constants of the equivalent circuit model and a predetermined threshold value.

20. The device of claim 17, wherein the vehicle battery of the unknown battery type is a lead-acid battery, a nickel hydride battery, a lithium ion battery, a nickel-cadmium battery, a flooded battery, a seal type battery, a battery for idling stop of a lead-acid battery, a new battery, or a used battery.

* * * * *